United States Patent [19]

Andres et al.

[11] Patent Number: 5,416,447
[45] Date of Patent: May 16, 1995

[54] SAW DEVICE AND METHOD OF MANUFACTURE

[75] Inventors: Donald Andres, Foxboro; Thomas E. Parker, Framingham, both of Mass.

[73] Assignee: Raytheon Company, Lexington, Mass.

[21] Appl. No.: 148,816

[22] Filed: Nov. 8, 1993

[51] Int. Cl.⁶ .................... H01L 41/04; H03B 5/32
[52] U.S. Cl. .................... 331/107 A; 310/313 R; 333/194; 333/195
[58] Field of Search .............. 310/312, 313 R, 313 B, 310/313 C, 313 D; 331/107 A, 154; 333/193, 195, 194, 152, 154

[56] References Cited

U.S. PATENT DOCUMENTS

| | | | |
|---|---|---|---|
| 4,194,171 | 3/1980 | Jelks | 333/149 |
| 4,270,105 | 5/1981 | Parker et al. | |
| 4,409,570 | 10/1983 | Tanski | 333/187 |
| 4,639,697 | 1/1987 | Yarranton et al. | 333/155 |
| 4,933,588 | 6/1990 | Greer | 310/313 |
| 5,208,504 | 5/1993 | Parker et al. | |

OTHER PUBLICATIONS

H. F. Tiersten et al., "An Analysis of the Normal Acceleration Sensitivity of ST–Cut Quartz Surface Wave Resonators Rigidly Supported Along the Edges", 41st Annual Frequency Control Symp.-1987, IEEE, pp. 282–288.

J. A. Greer et al., "Improved Vibration Sensitivity of the All Quartz Package Surface Acoustic Wave Resonator", 42nd Annual Frequency Control Symp.-1988, IEEE, pp. 239–251.

T. E. Parker et al., "SAW Oscillators With Low Vibration Sensitivity", 45th Annual Symp. on Freq. Control, 1991 IEEE, pp. 321–329.

*Primary Examiner*—Robert J. Pascal
*Assistant Examiner*—David Vu
*Attorney, Agent, or Firm*—Donald F. Mofford

[57] ABSTRACT

A SAW oscillator circuit including a housing having disposed therein a surface wave propagation supporting substrate with a pair of transducers coupled by surface waves propagating through the substrate and electronic circuitry connected to the pair of transducers and arranged to provide, with the connected resonator, the SAW oscillator circuit. A weight is attached to the resonator. The housing is susceptible of vibratory deflections which induce vibratory deflections in the substrate and the weight suppresses the vibratory deflections induced in the substrate of the resonator. With such arrangement, while sufficiently thick externally mounted stiffeners are not used because of space limitations, the effects of vibratory deflections induced in the substrate of the insufficiently thick, or un-stiffened housing are compensated by the weight attached to the resonator.

12 Claims, 9 Drawing Sheets

SAW DEVICE AND METHOD OF MANUFACTURE

BACKGROUND OF THE INVENTION

This invention relates generally to surface acoustic wave (SAW) devices and, more particularly, to surface acoustic wave devices having low vibration sensitivity.

As it is known in the art, surface acoustic wave (SAW) devices are employed in a variety of applications, such as resonators and delay lines for oscillator circuits, as well as, filters and pressure transducers. Generally, a SAW device comprises at least one transducer including a set of conductive members which is disposed on or recessed within a surface of a piezoelectric substrate.

In many applications of SAW devices, particularly with respect to applications of resonators and delay lines, as frequency stabilizing and determining elements in an oscillator circuit, it is important to provide a housing having a relatively small size in order to reduce the so-called vibration sensitivity of the SAW device. At the same time, the housing must be large enough to accommodate the SAW device along with additional, associated electronic circuitry used to complete the oscillator circuit.

It is known that the resonant frequency of an oscillator circuit, including a SAW device, is sensitive of external vibration or changes in external stress applied to the SAW device. The effect of mechanical vibration may degrade the performance of a SAW device in an oscillator circuit application, for example, by modulating the output frequency of the oscillator circuit. The frequency modulation occurs due to deflections of the SAW device substrate through which surface waves propagate. These deflections can be generated internally due to vibrations in the mass of the substrate, or can be externally induced from vibratory bending of the housing. Deflections due solely to vibrations of the mass of the SAW device substrate have been discussed in the following articles: "An Analysis of the Normal Acceleration Sensitivity of ST-Cut Quartz Surface wave Resonators Rigidly Supported Along the Edges" by H. F. Tiersten and D. V. Schick, Proc. of the 41st Ann. Symp. on Freq. Control., 1987, pp. 282; and "Improved Vibration Sensitivity of the All Quartz Package Surface Acoustic Wave Resonator", by J. A. Greer and T. E. Parker, Proc. of the 42nd Ann. Symp. on Freq. Control, 1988, pp. 239. The sensitivity results from the applied acceleration on the piezoelectric substrate causing changes in surface wave velocity and hence resonant frequency characteristics of the SAW device. In particular, the surface wave velocity is influenced by applied forces through the second order elastic coefficients of the material of the SAW substrate and also because the physical distance between the transducers or gratings on the substrate is changed. Thus, both of these factors contribute to net frequency change in SAW devices such as delay lines and resonators.

With regard to externally induced vibrations caused from bending of the housing, one approach has been to attach externally mounted stiffeners to the housing to reduce the amount of vibratory bending of the housing. Such technique is described in U.S. Pat. No. 5,208,504, entitled "SAW Device and Method of Manufacture", inventors, Thomas E. Parker and James A. Greer, issued May 4, 1993 and assigned to the same assignee as the present invention. The patent describes the use of a housing containing the SAW device and its associated electronic circuitry. Mounted to the outer surface of the housing is an alumina stiffener. The stiffener, ranging in thickness from about 0.38 to 0.5 inches, depending on the size of the housing, is sufficiently thick to minimize housing deflections. While the use of such stiffeners has reduced the vibratory bending of the housing, and hence the vibrations induced in the SAW device substrate, in some applications there is not enough space for the now larger housing-stiffener combination.

SUMMARY OF THE INVENTION

With this background of the invention in mind, it is therefore an object of this invention to provide an improved SAW device.

It is another object of this invention to provide an improved SAW device having relatively low vibratory sensitivity.

It is another object of this invention to provide an improved SAW device oscillator having relatively low vibratory sensitivity and adapted for disposition in a relatively small housing.

These and other objects of the invention are attained generally by providing a SAW device having a surface wave propagation supporting substrate with a pair of transducers coupled by surface waves propagating through the substrate and a weight attached to the substrate.

In a preferred embodiment, a SAW oscillator circuit comprises a housing having disposed therein a surface wave propagation supporting substrate with a pair of transducers coupled by surface waves propagating through the substrate and electronic circuitry connected to the pair of transducers and arranged to provide, with the connected resonator, the SAW oscillator circuit. A pair of weights is attached to, one on either side of the center of, the substrate. The housing is susceptible of vibratory deflections which induce vibratory deflections in the substrate and the weights suppress the effects of vibratory deflections induced in the substrate. With such arrangement, while sufficiently thick externally mounted stiffeners are not used because of space limitations, the effects of vibratory deflections induced in the substrate of the partially stiffened housing are compensated by a discrete weight attached to the substrate.

In accordance with a further aspect of the present invention, a SAW oscillator includes means for providing a closed electrical circuit loop having an integral multiple of $2\pi$ radians of phase shift and excess small signal gain at a selected frequency. Said means further includes a surface acoustic wave substrate with a surface which supports surface wave propagation and a pair of transducers coupled through the surface wave propagation surface. A SAW device housing includes: a resonator package made up of the substrate; a cover; and a glass frit disposed around the sides of the package for enclosing the surface wave propagation surface of the SAW substrate. The housing comprising: a base for supporting the SAW device resonator package and electronic circuitry coupled to pair of transducers to provide, with the surface acoustic wave resonator, the closed electrical circuit loop. A discrete weight is attached to the resonator to suppress the effects of vibratory deflections induced in the substrate by vibratory deflections of the housing. With such arrangement, a housing can be provided of sufficient size to accommodate both the SAW resonator package and associated electronics to provide the closed electrical circuit loop while the effects of vibratory deflections induced in the substrate of the partially, but insufficiently, or unstiffened, housing are compensated by a discrete weight attached to the resonator package.

BRIEF DESCRIPTION OF THE DRAWINGS

The foregoing features of this invention, as well as the invention itself, may be more fully understood from the following detailed description of the drawings, in which:

FIG. 6B being a plot with the use of a pair of the weights of FIGS. 4A and 4B; and FIG. 6A being a plot without the use of such weights;

FIG. 8B being a plot with the use of a pair of the weights of FIGS. 4A and 4B; and FIG. 8A being a plot without the use of such weights;

FIG. 9B being a plot with the use of a pair of the weights of FIG. 4A and 4B; and FIG. 9A being a plot without the use of such weights;

FIG. 10B being a plot with the use of a pair of the weights of FIG. 4A and 4B; and FIG. 10A being a plot without the use of such weights;

FIG. 11B being a plot with the use of a pair of the weights of FIG. 4A and 4B; and FIG. 11A being a plot without the use of such weights.

DESCRIPTION OF THE PREFERRED EMBODIMENTS

Figure 1:
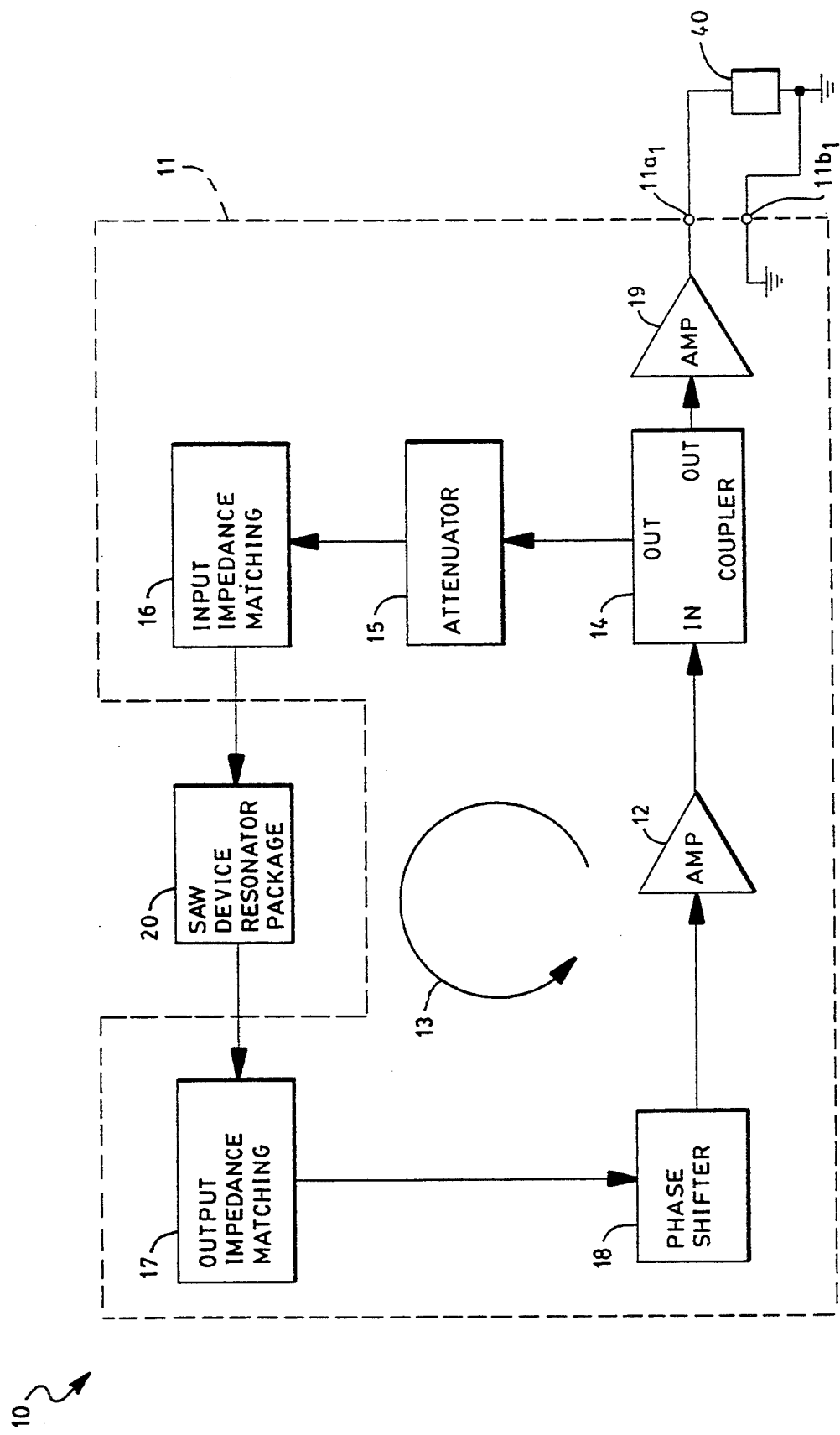
FIG. 1 is a block diagram showing the SAW device resonator used as a frequency stabilizing determining element in an oscillator circuit.

Referring now to FIG. 1, a stable oscillator circuit 10 is shown to include an amplifier 12 disposed in a feedback loop denoted by an arrow 13. The feedback loop 13 further includes coupling means 14, attenuator 15, input impedance matching network 16, a SAW device resonator package 20, an output impedance matching network 17, and a phase shifter 18. The SAW device resonator package 20 is used in the feedback loop 13 to stabilize the phase and frequency characteristics of the signal in the feedback loop 13. The output of the amplifier 12 is coupled to here the input port of the coupling means 14. The coupling means 14 is here a microstrip type directional coupler although a center tap transformer may alternatively be used. A first branch output port of coupling means 14 is coupled to the attenuator 15. A second branch port, here an output port of the coupling means 14, is coupled to a second amplifier 19. Here, a conventional amplifier used to provide an amplified output signal to output terminals $11a_1$, $11b_1$. The coupling means 14 is thus used to divide the output signal provided from amplifier 12 and to feed a first portion of the signal to a conventional attenuator 15 and in a second portion signal to the output amplifier 19 in a predetermined ratio. A division ratio of 10 to 1 is typically used so that 1 part in 10 of the signal is fed to the input of the output amplifier 19 and the remaining portion of the signal is coupled to attenuator 15 and is fed back to the amplifier 12 via the remaining portion of the feedback loop 13. The output amplifier 19 is used to provide an amplified output signal in response to the signal provided by the oscillator circuit 10 and to feed such amplified output signal to output terminals $11a_1$, $11b_1$ and hence to a load 40.

The frequency of the oscillator circuit 10 is related to the closed loop phase and frequency characteristics of the feedback loop 13. Such a circuit 10 will oscillate at a frequency in which the phase shift around the loop is an integer multiple of $2\pi$ radians and at which the loop 13 has excess small signal gain, as is known. The phase and frequency characteristics of the feedback loop 13 are thus adjusted by the phase shifter 18 which is used to change the oscillator frequency. The phase and frequency characteristics of the SAW resonator package 20, phase shift, and other components of the feedback loop 13, as is known in the art, also contribute to determining the phase and frequency characteristics of the loop 13. The attenuator 15 may optionally be required to control the signal level in the feedback loop 13 of the oscillator circuit 10. Also, depending upon the characteristics of the various circuits, conventional input and output impedance matching networks 16 and 17 are optionally used to match the impedances in the feedback to the impedances of the SAW resonator package 20. Such input and output impedance matching networks 16, 17 and attenuator 15 however are not always required.

The SAW resonator included in the SAW resonator package 20 or alternatively a SAW delay line (not shown) in combination with the phase shifter 18 provides a fixed and coarsely adjustable phase shift to the input of the amplifier 12 thereby supplying the requisite phase shift characteristics to the input of the amplifier 12 at a particular frequency. Phase shifter 18 could be a coarsely adjustable phase shifter, an electronically controlled phase shifter provided by varactor diodes, for example, or other suitable phase shifter elements, as is commonly known in the art. The major portion of the phase shifter in the feedback loop 13, is provided by the resonator in the resonator package 20 (or alternatively delay line) with the phase shifter 18 providing a relatively small adjustment in the phase characteristics in the feedback loop 13 thus enabling tuning of the resonant circuit of the oscillator circuit to a desired frequency output frequency. Since the SAW resonator in package 20 provides a substantially complete and relatively stable portion of the delay around the feedback loop 13, the frequency of the oscillation from the oscillator will be likewise relatively stable.

In particular, for precision oscillator applications in a vibrating environment, the effects of applied external stress on the SAW oscillator circuit 10 results in fluctuations in the frequency of oscillation of the output signal from the oscillator circuit 10. It is generally desirable to reduce such fluctuations to significantly low levels. Theoretically, oscillators using SAW resonators as stabilizing elements could exhibit vibration induced frequency fluctuations in the order of about $10^{-11}$ fractional change in frequency per "g" of applied acceleration, where g is the acceleration due to gravity.

Figure 2:
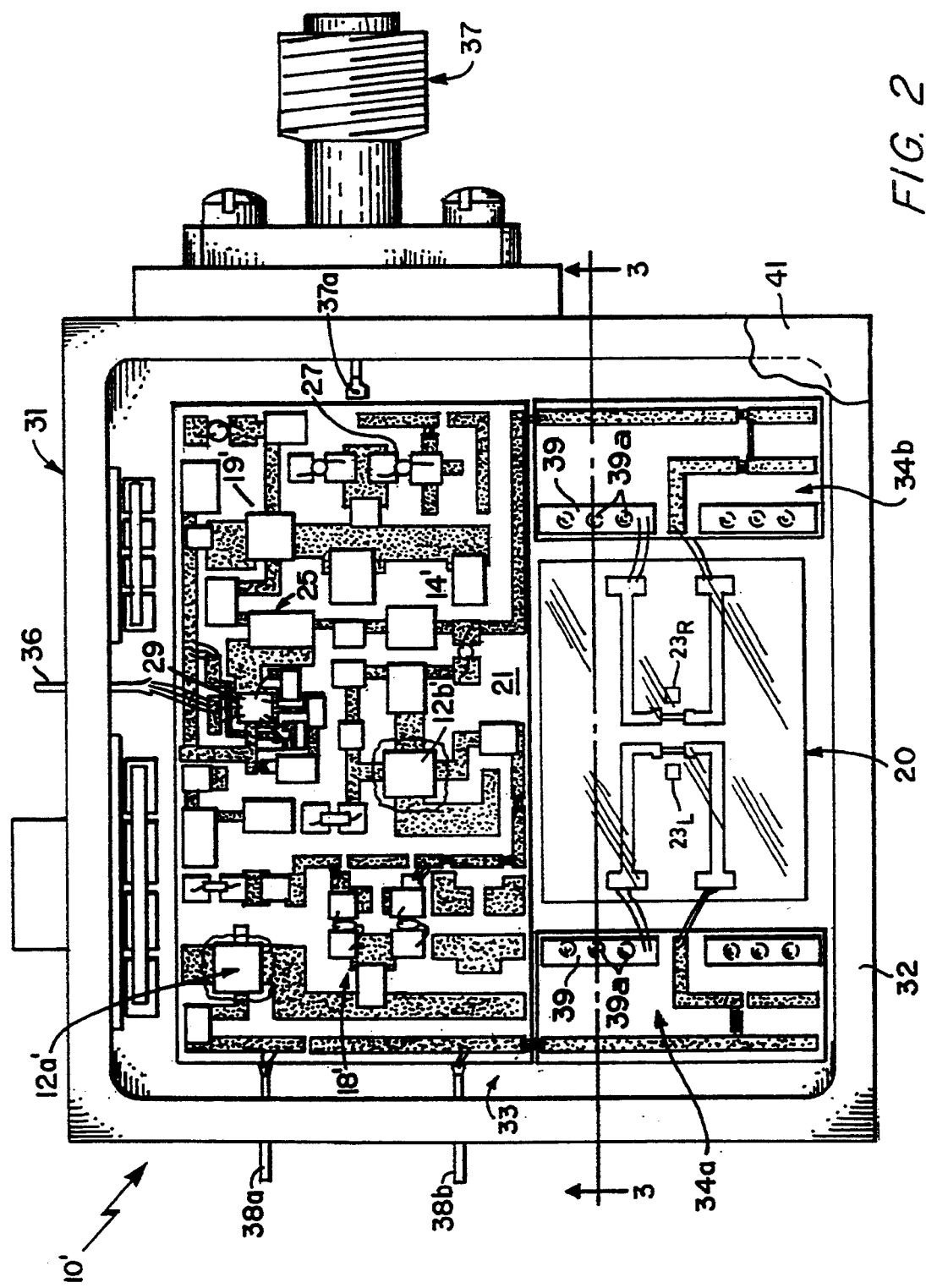
FIG. 2 is a plan view of a SAW oscillator housing partially broken away, having a SAW device resonator package and hybrid electronic circuitry electrically coupled to the SAW device resonator package and arranged used to provide the SAW oscillator circuit of FIG. 1.

Referring now to FIG. 2, a typical implementation of the SAW oscillator circuit 10 (FIG. 1) is shown to include an oscillator housing 31. A first dielectric carrier 21, here comprised of alumina (i.e. aluminum oxide), having disposed over a first side thereof pattern strip conductors comprised of here gold (not numbered) and having disposed over a second surface thereof a ground plane conductor of here gold (not shown) bonded into the base portion of the oscillator housing 31. The patterned conductors are arranged to provide interconnections to the amplifiers 12a, 12b, as shown, as well as the other components of the oscillator 10. Here two amplifiers 12a and 12b are used to provide the amplifier 12 (FIG. 1) in the feedback loop 13 to provide sufficient small signal gain at a desired frequency. The oscillator circuit 10 in FIG. 2 further includes a phase shifter 18, here a fixed frequency phase shifter comprised of a L-C-L T-network (not individually referenced), and a directional coupling means 14, which, with the amplifiers 12a, 12b, complete the components on carrier 21 which are part of the feedback loop 13 (FIG. 1). Disposed here outside of the loop 13 is an attenuator 15 as well as the amplifier 19. The output of amplifier 19 is connected to a center conductor 37a of a standard coaxial connector 37, here an SMA type connector. Connector 37 is attached to the housing 31 via a pair of screws (not numbered). The housing 31 includes a base portion 33, as well as, an outer peripheral frame portion 32 which is integrally provided with the base portion 33. That is, the base portion 33 is here machined from a slab of material (such as "KOVAR" which is gold plated) to form the recessed base portion 33 and provide the frame 32 disposed about the periphery of the base portion 33 of the housing. A through-pin 36 is disposed through the frame 32 of housing 31 and dielectrically isolated therefrom to provide DC bias to a voltage regulator integrated circuit on carrier 21. The other circuits on carrier 21 are connected by conductors from the voltage regulator 29 to provide regulated DC voltages to the various circuits, as would generally be known to one of skill in the art. Through-pins 38a, 38b are also provided through the housing 31 and are used for testing purposes but are generally disconnected, during user operation. The strip conductors (not numbered) disposed adjacent the pins are jumped together with bond wires for normal operation of the oscillator circuit 10. Pins 38a, 38b and breaks in the strip conductor (not numbered) adjacent the pins 38a, 38b are provided such that during testing and calibration an open loop condition can be provided which is used to set the various parameters of the loop, whereas after testing a closed loop is provided by disposing conductors (not shown) across the break in strip conductors adjacent the pins and disconnecting the pins. Distributed as needed on the carrier 21 are ground conductor strips 39 which are coupled to the ground plane conductor (not shown) on the underside of carrier 21 by plated vias 39a, as shown.

The oscillator circuit 10 further includes a pair of carriers 34a, 34b here also comprised of alumina and which have on a first underside thereof a ground plane conductor (not shown) and have disposed on the top surfaces thereof the ground conductor strips 39 having plated via holes 39a, as well as, patterned strip conductors used to provide microstrip transmission lines to electrically interconnect the SAW resonator in the resonator package 20 to the hybrid circuit generally provided on carrier 21.

The exact implementation of the oscillator circuit 10 as described above would be apparent to one of ordinary skill in the art and any oscillator design would be useful in practicing the present invention.

Preferably, in order to reduce vibration sensitivity, the integrated circuits, in particular, the amplifier circuits 12a, 12b, and 19 are bonded to the surface of the carrier 21 by use of here a non-conductive epoxy. One particular epoxy used is "EPO-TEK" type H70E-175 (Epoxy Technology, Inc., Billerica, Mass.). Conductive epoxies which are used in the hybrid to fasten components securely to the carrier include EPO-TEK H20E-175. It is important when fabricating the particular hybrid circuit 11 on a carrier 21 that the components be securely affixed to the carrier 21 to prevent microphonic induced noise in the oscillator.

Figure 3:
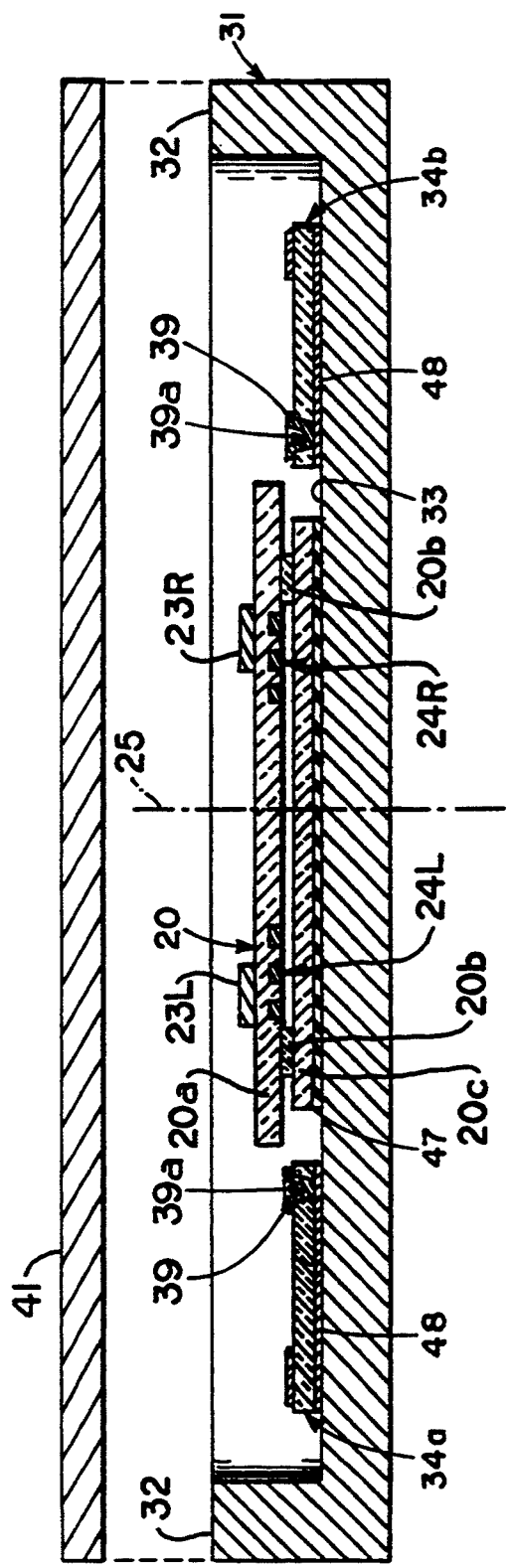
FIG. 3 is a cross-sectional view taken along lines 3—3 of FIG. 2.

The SAW resonator package 20 is here obtained from Raytheon Company, Research Division, Lexington, Mass. (SMDO) and is a resonator, packaged in a Raytheon All-Quartz Package (AQP) although another resonator may alternatively be used. In particular, as shown in FIG. 3, the so-called All-Quartz Package resonator package 20 includes a surface wave propagation supporting substrate 20a having a pair of transducers $24_L$, $24_R$ disposed in recesses provided within the supporting substrate 20a on opposite sides of the centerline 25 of the substrate 20a. The pair of transducers $24_L$, $24_R$ are mutually coupled by surface waves propagating through the substrate 20a. The resonator package 20 also includes a cover portion 20c secured to the substrate 20a by a glass frit seal 20b. Here, for best vibration performance the cover 20c portion of the package is mounted on, here attached to, the base portion 33 of the oscillator housing 31. The cover 20c is thus spaced from the substrate 20a by the glass frit seal 20b which in combination provide a sealed enclosure for the resonator package 20. In the All-Quartz Package the cover 20c and substrate 20a are crystallographically matched and are both comprised of an ST-cut of quartz. The exact rotated Y cut being specified by the user depending upon temperature considerations as is known.

As shown in conjunction with FIG. 3, the carriers 34a and 34b are secured to the base portion 33 of the housing 31 using a conventional epoxy bond 48 whereas the all-quartz SAW device resonator package 20 is mounted upside down (i.e. the substrate 20a is mounted upside down with the cover 20c mounted on the base portion 33) in the oscillator circuit 10 and is attached to the housing 31 by use of a sheet adhesive 47 generally known as 3M (Minneapolis, Minn.), "Isotac" A-10 adhesive, part number Y-9473 having a thickness of 0.010 inches. Preferably a silicone PSA tape manufactured by the CHR Division of Furon Company is used although other adhesives or tapes may alternatively be used.

In general, the oscillator housing 31 is comprised of a metal such as Kovar. The Kovar which is an alloy of 29% Ni, 17% Co, 0.3% Mn and balance Fe has a certain elastic modulus (Young's modulus) characteristic. It has a concomitant stiffness characteristic which is related to the thickness of the base, orientation of the frame, and elastic modulus of the material of the housing 31. A cover 41, here also Kovar, is disposed over the top of the housing 31, as shown.

Low vibration sensitivity is provided from the oscillator circuit 10 as described in conjunction with FIGS. 1-3 by providing a SAW resonator package 20 with a glass frit geometry suitable for low vibration sensitivity, as generally described in an article entitled: "An Analysis of the Normal Acceleration Sensitivity of ST Cut Quartz Surface Wave Resonators Rigidly Supported along the Edges" by Tiersten, et al., Proceedings of the 41st Annual Symposium on Frequency Control, 1987, pages 282-288. Any one of the preferred frit geometries identified by the authors in the paper may be used to provide optimum performance. The theory set forth by the authors state that with proper choice of the frit geometry, vibration sensitivities in the low $10^{-11}$ fractional parts frequency per "g" of applied stress range would be obtainable, such low vibration sensitivity levels have not been observed in practice. One of the problems with the theoretical analysis is that it is based on the assumption that the frit geometry is perfect everywhere and that there are no misalignment or local deviations from straight lines. Furthermore, another assumption is that the applied acceleration is uniformly distributed over the entire mounting surface of the SAW device. In practice neither one of these assumption is perfectly true. That is, the SAW device resonator package 20 is generally not mounted uniformly over the Kovar package base portion 33 and due to differences in the melt characteristics of the glass frit, the glass frit pattern will deviate from the ideal theoretical patterns described in the above article.

In accordance with this invention, vibratory deflections of the SAW oscillator housing 31 which are coupled to the substrate 20a of the resonator package 20 are suppressed by the use of a pair of discrete weights $23_L$, $23_R$ mounted to the outer surface of the substrate 20a at discrete positions, on opposite sides of the center line 25 of such substrate 20a. In response to external stresses on the housing 31, strains are provided in the material of the housing 31. That is, the housing 31 bends in response to applied external stresses. Bending and straining of the housing 31 causes concomitant bending and straining of the SAW resonator package 20, and in particular the substrate 20a, which is mounted to the housing 31 base portion 33 (even though the SAW resonator package 20 may be mounted upside down on the housing 31). At the vibration levels of interest (DC to 10's of KHz), such minute strains and bending become extremely important.

In accordance with the invention, the housing 31 can be provided of sufficient size to accommodate both the SAW resonator package 20 and associated, electrically connected electronics to provide the closed electrical circuit loop while the effects of vibratory deflections induced in the substrate 20a of the un-stiffened, or partially stiffened housing 31 are compensated by the pair of weights $23_L$, $23_R$ mounted on the package 20, here to the outer surface of the substrate 20a. (That is, the substrate 20a has two opposing surfaces: an inner surface, having formed thereon the pair of mutually coupled transducers $24_L$, $24_R$; and, an outer surface, having disposed thereon the pair of discrete weights $23_L$, $23_R$.

Figure 4A:
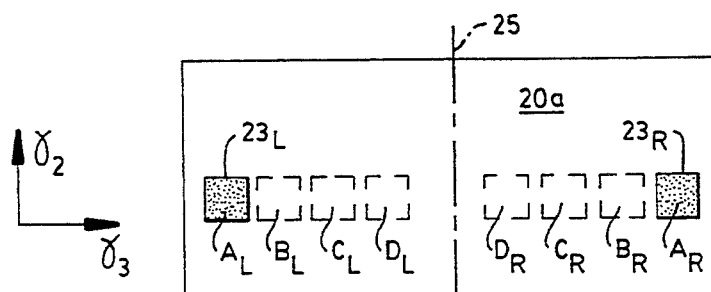
FIGS. 4A and 4B are diagrams showing the relationship between various mounting positions of weights on the SAW resonator package of FIG. 2 used to suppress the effects of vibratory deflections induced in a substrate of the SAW device resonator package by vibratory deflections of the housing in FIG. 2.
Figure 4B:
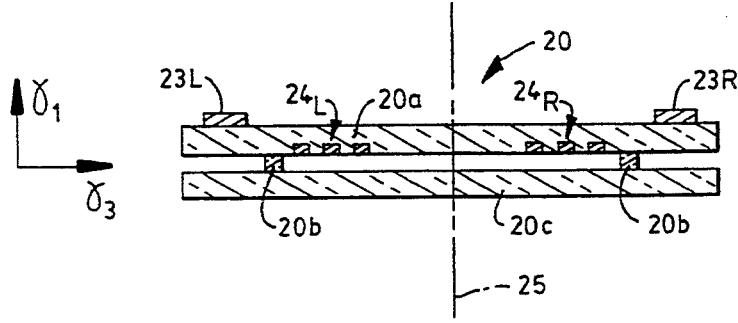

The overall vibration sensitivity is the vector sum of the individual sensitivities for the three orthogonal axes $$\overline{\Gamma} = \gamma_1 \cdot \overline{X} + \gamma_2 \cdot \overline{Y} + \gamma_3 \cdot \overline{Z}$$

where $\gamma_1$, $\gamma_2$, and $\gamma_3$ are the individual vibration sensitivities for each axis (such axis, $\gamma_1$, $\gamma_2$, and $\gamma_3$ being shown in FIGS. 4A and 4B) and $\overline{X}$, $\overline{Y}$, and $\overline{Z}$ are unit vectors for each respective axis. We have been able to reduce the overall sensitivity by attaching two small weights $23_L$, $23_R$ here of approximately 0.06 grams each, to the backside, or outer surface, of the substrate 20a of the All Quartz Package SAW resonator package 20, as shown in FIG. 3. The optimum location was determined by repositioning the weights $23_L$, $23_R$ until the vibration sensitivity was minimized. Referring to FIGS. 4A and 4B, each one of a pair of weights $23_L$, $23_R$ was placed, successively at positions $A_L$, $B_L$, $C_L$, $D_L$, and $A_R$, $B_R$, $C_R$, and $D_R$. The positions $A_L$, $A_R$, are approximately symmetrically spaced about centerline 25 of the outer surface of substrate 20a. Likewise, positions: $B_L$, $B_R$; $C_L$, $C_R$; and $D_L$, $D_R$ are symmetrically spaced, respectively, about centerline 25 of the outer surface of substrate 20a, as shown, in FIG. 4A. Thus, when the weights $23_L$, $23_R$ are at position $A_L$, $A_R$, the distance of the weights $23_L$, $23_r$ from the centerline 25 is A. Likewise, the distances from centerline 25 when the weights $23_L$, $23_R$ are at positions: $B_L$, $B_R$; $C_L$, $C_R$; and $D_L$, $D_R$, are B, C, and D, respectively.

Figure 5:
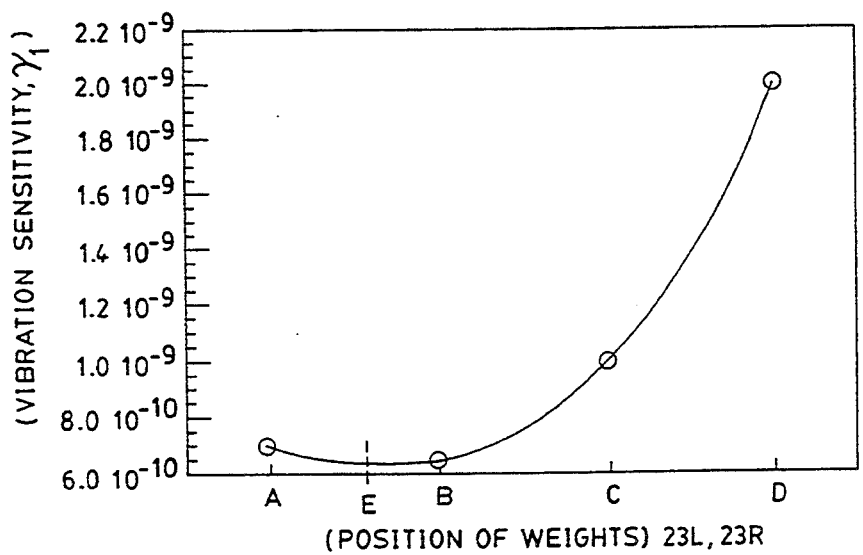
FIG. 5 is a plot of vibration sensitivity of the oscillator of FIG. 2 vs. the position of the weights of FIGS. 4A and 4B.

The distance A, B, C and D of the weights $23_L$, $23_R$ from the centerline 25 versus $\gamma_1$ is shown in FIG. 5. The distance of the weights $23_L$, $23_R$ has a dramatic affect on the vibration sensitivity by changing the amount of deflection in the SAW resonator substrate 20a. The weights $23_L$, $23_R$ reduce the $\gamma_1$ by canceling the effect of the bending, or vibratory deflections, of the SAW resonator 20 substrate 20a induced by the vibratory bending, or deflections of the housing 31. Thus, as shown in FIG. 5, placing weights $23_L$, $23_R$ at a distance E, slightly short of the distance B, results in the minimum vibration sensitivity, $\gamma_1$.

Figure 7:
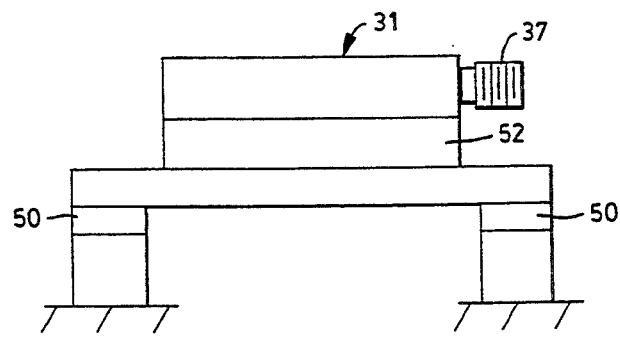
FIG. 7 is diagram showing the test set up for an oscillator having a partially stiffened housing.
Figure 6A:
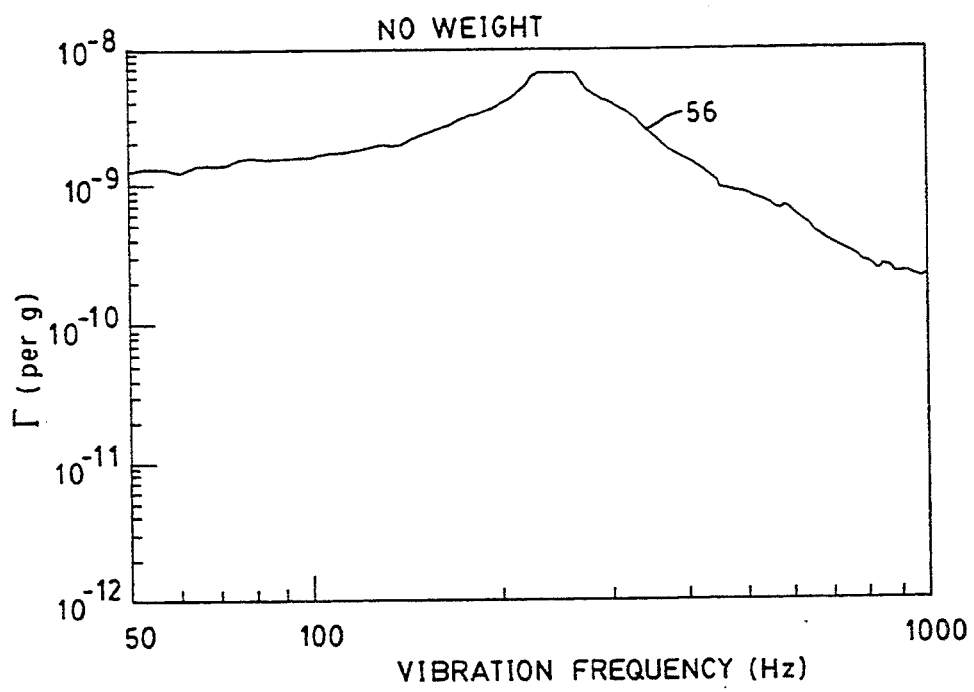
FIGS. 6A and 6B are plots of vibration sensitivity, $\overline{\Gamma}$ of a first oscillator of FIG. 2 having a partially stiffened housing vs. frequency.
Figure 6B:
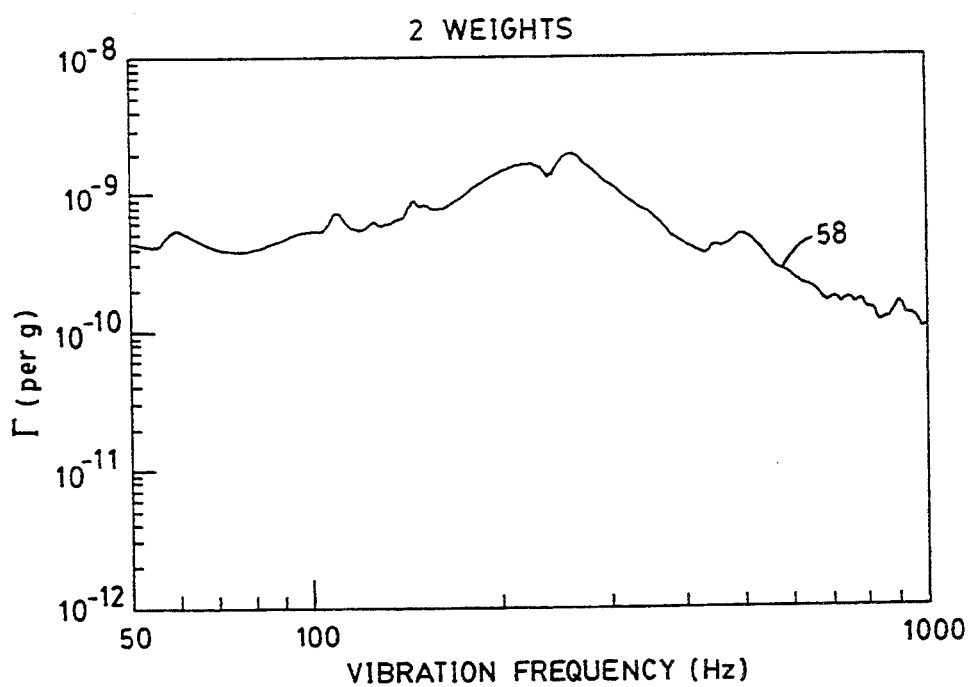

Referring now to FIGS. 6A and 6B, curves 56, 58 show vibration sensitivity, $\overline{\Gamma}$ for a partially stiffened housing 31 with and without the use of weights $23_L$, $23_R$ (i.e., with and without mass loading), respectively. (The housing 31 was partially stiffened in that a 0.25 inch thick alumina stiffener was used on the housing instead of a 0.5 inch thick stiffener which was preferred. The space available would not accommodate the preferred 0.5 inch thick stiffened but would accommodate a 0.25 inch thick stiffener used for the partially stiffened housing 31). The vibration sensitivities, $\gamma_1$, $\gamma_2$, and $\gamma_3$ were measured for both oscillators in order to calculate $\overline{\Gamma}$. This was measured without the weights $23_L$, $23_R$ and the results are shown by curve 56 in FIG. 6A. This performance is typical of similar devices without the weights $23_L$, $23_R$ (i.e., mass loading) and without the use of stiffeners. The peak vibration sensitivity, shown by curve 56 in FIG. 6A, occurs around 250 Hz and is due to a resonance in the housing 31. The housing 31 was mounted on silicon bushings 50, as shown in FIG. 7. The silicone bushings 50 provide vibration isolation at higher frequencies, as evidenced by the reduction in $\Gamma$ above 300 to 500 Hz. The price paid for the isolation above 300 Hz is the increased sensitivity at resonance. The vibration sensitivity near 50 Hz reflects the lack of stiffness in the housing 31 (i.e., in the absence of a preferred, or optimum, stiffener 52 mounted to the outside of the housing 31 when such housing 31 was tested using a stiffener in accordance with the above referenced U.S. Pat. No. 5,208,504). It is expected that the same oscillator circuit 10 with a very stiff structure (i.e., a housing using the stiffener 52 in accordance with the above referenced U.S. Pat. No. 5,208,504) would have a $\bar{\Gamma}$ around $3 \times 10^{-10}$ at all vibration frequencies.

Figure 8A:
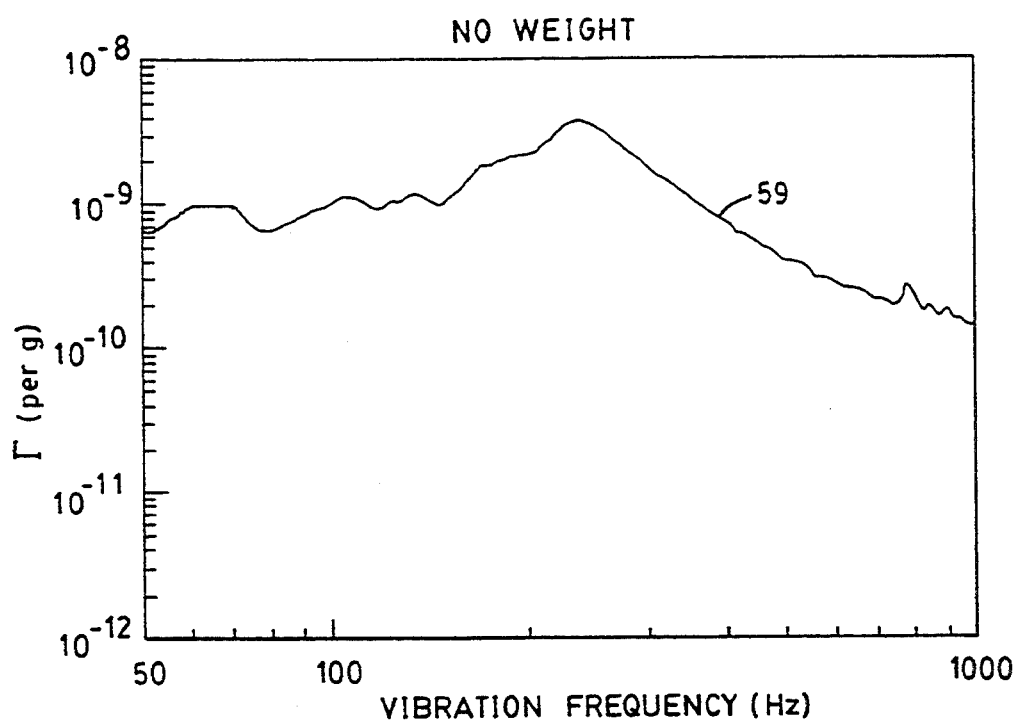
FIGS. 8A and 8B are plots of vibration sensitivity, $\overline{\Gamma}$ of a second oscillator of FIG. 2 having a partially stiffened housing vs. frequency.
Figure 8B:
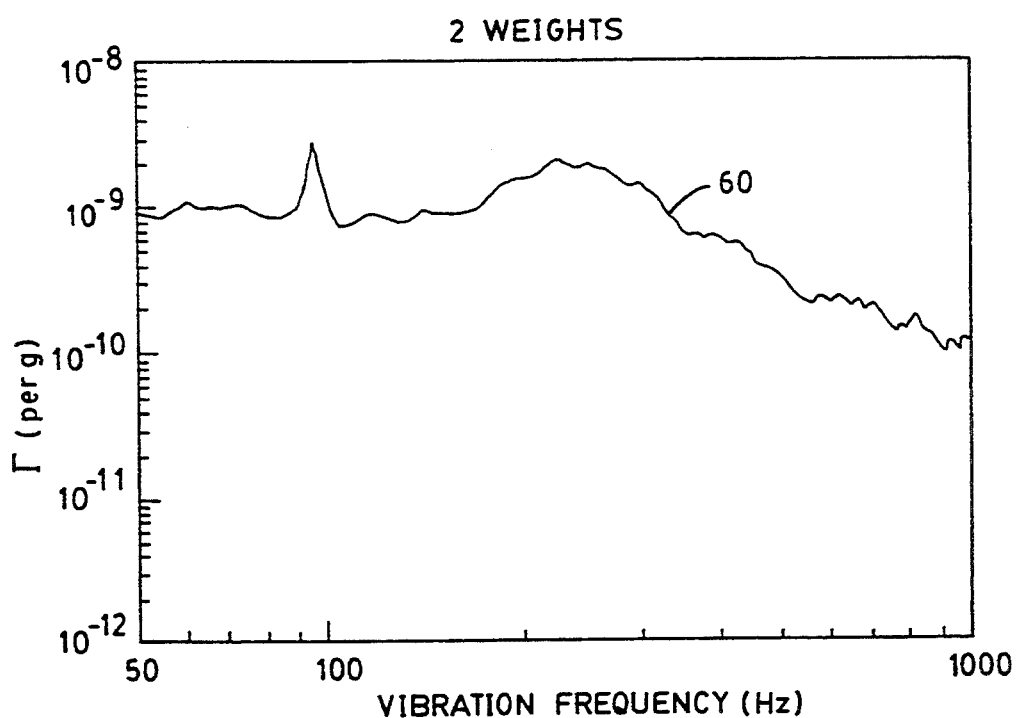

Next, two weights each $23_L$, $23_R$ were then bonded to the right and left, respectively of the centerline 25 of the substrate 20a of the resonator package 20 (i.e. the AQP), as shown in FIG. 4, again using the same partially stiffened housing 31 tested to produce the curve 58 in FIG. 6B. The same vibration test was repeated on another oscillator circuit 10 to confirm the previous results. The results are shown in FIG. 8A for the no weights $23_L$, $23_R$ condition by curve 59, and, FIG. 8B for the condition where two weights 23 are used on each side of the centerline 25, by curve 60. A comparison of curves 59, 60 shows that this oscillator circuit 10 did not show the same net reduction in $\bar{\Gamma}$ but the overall sensitivity after mass loading was comparable to the first oscillator.

Figure 9A:
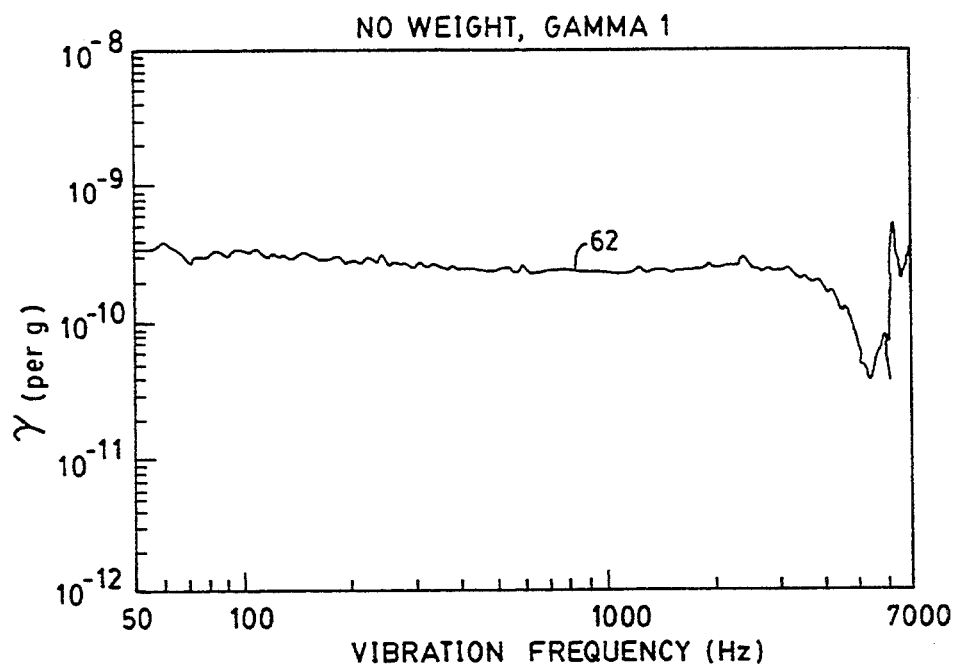
FIGS. 9A and 9B are plots of the $\gamma_1$ vibration sensitivity of the oscillator circuit of FIG. 2 having a stiffened housing vs. frequency.
Figure 9B:
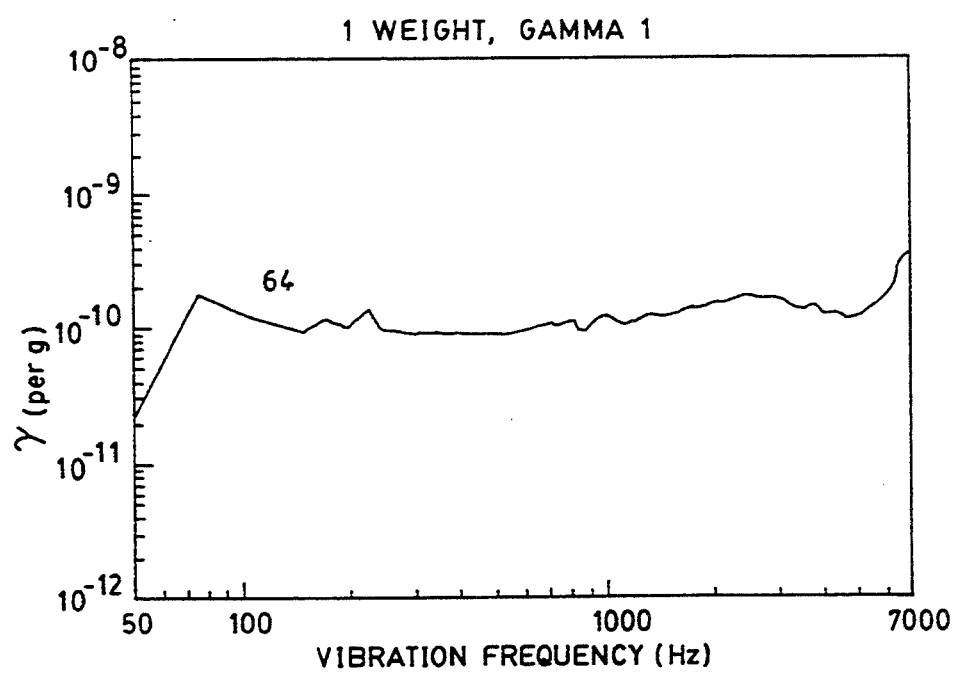
Figure 10A:
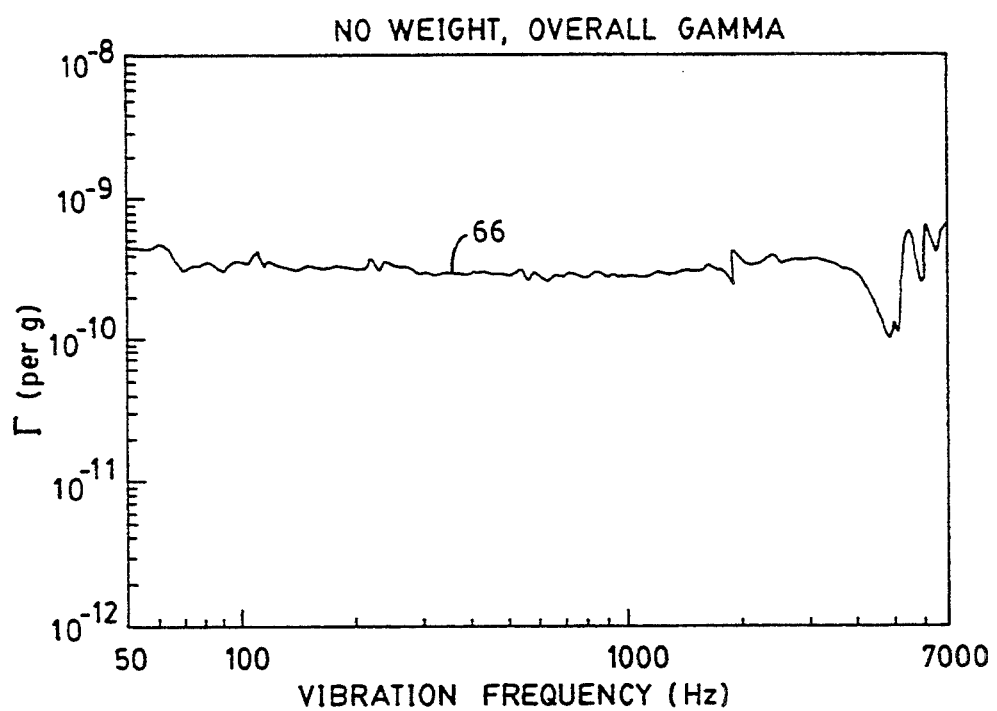
FIGS. 10A and 10B are plots of vibration sensitivity, $\overline{\Gamma}$ the oscillator circuit of FIG. 2 having a stiffened housing vs. frequency.
Figure 10B:
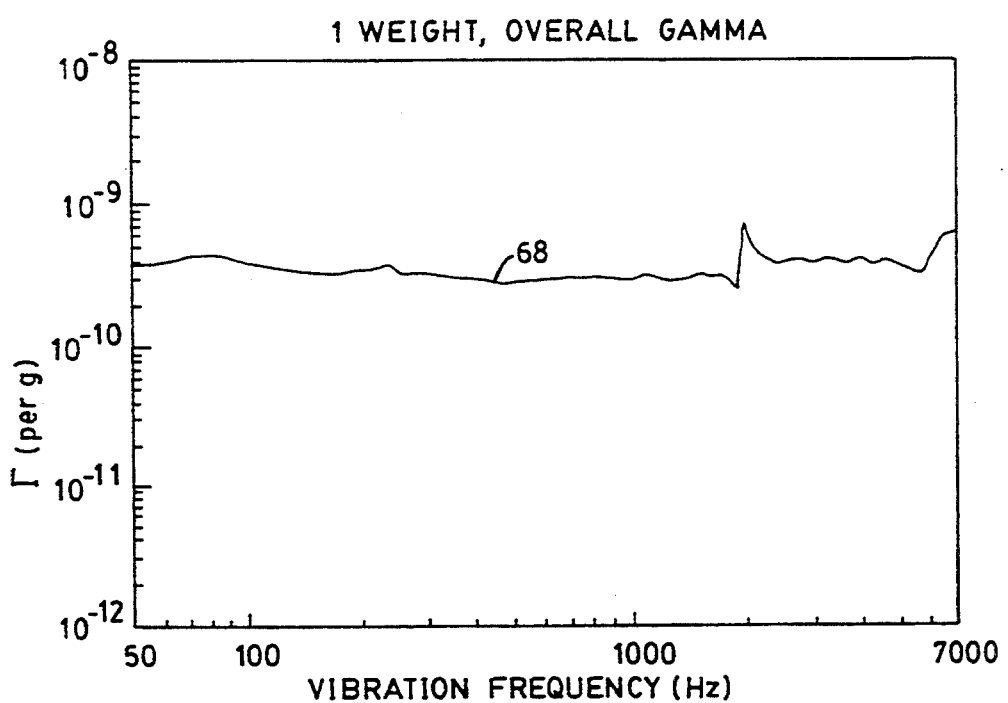
Figure 11A:
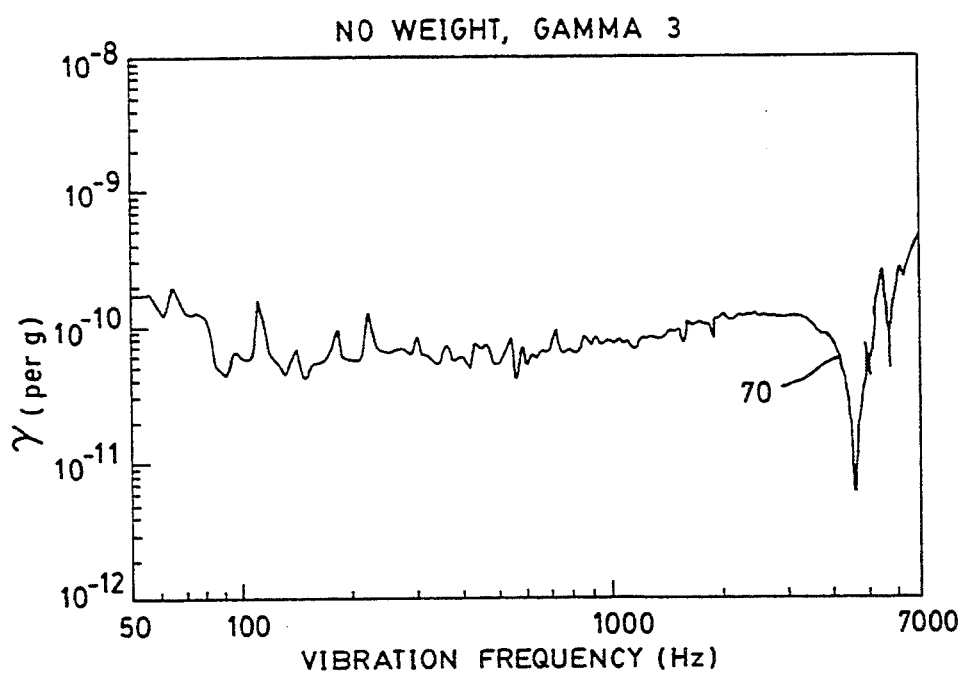
FIGS. 11A and 11B are plots of $\gamma_3$ vibration sensitivity for the oscillator circuit of FIG. 2 having the stiffened housing vs. frequency.
Figure 11B:
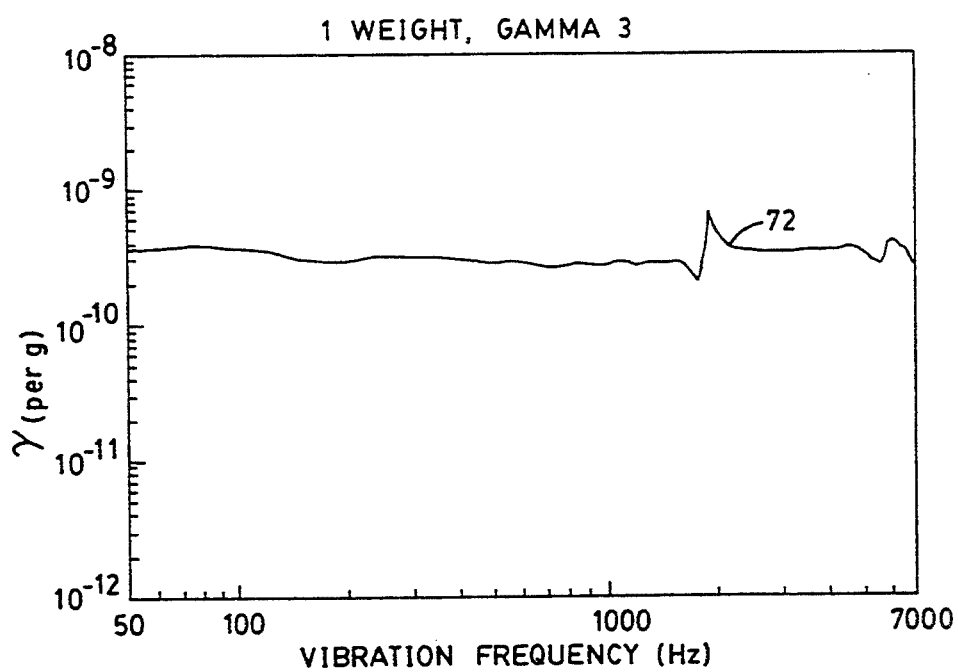

Similar experiments were performed on the same type of SAW oscillator circuit 10, except that these resonator packages 20 were mounted directly to a housing 31 having stiffeners 52 according to the above referenced U.S. Pat. No. 5,208,504. The stiffeners 52 were sufficiently thick so as to eliminate stresses within the housing 31. First, the $\gamma_1$ vibration sensitivity was measured without the weights 23 and the result is shown by curve 62 in FIG. 9A. Next, each one of a pair of weights $23_R$, $23_L$ was mounted on each side of the centerline 25 of the outside surface of the substrate 20a of the AQP resonator package 20 at a location which reduced $\gamma_1$ (as discussed in connection with FIG. 5). The $\gamma_1$ vibration sensitivity is shown by curve 64 (FIG. 9B). The vibration sensitivity in the other two orthogonal directions, $\gamma_2$ and $\gamma_3$, were then measured. The overall vibration sensitivity $\bar{\Gamma}$ is shown by curve 66 in FIG. 10A for the condition when there are no weights 23. The overall vibration sensitivity $\bar{\Gamma}$ is shown by curve 68 in FIG. 10B for the condition when there is one weight $23_R$ on the right and one weight $23_L$ on the left sides of the centerline 25. It is noted that with the stiffened housing 31, the overall vibration sensitivity $\bar{\Gamma}$, for the oscillator circuit 10 without weights 23 (i.e., curve 66) and with one weight 23 on both the right and left sides of the centerline 25 (i.e., curve 68) are nearly identical. Examination of $\gamma_3$ before the addition of the pair of weights $23_L$, $23_R$ (curve 70, FIG. 11A) and after the addition of weights $23_L$, $23_R$ (curve 72 FIG. 11B) reveals that the reduction in $\gamma_1$ was offset by an increase in $\gamma_3$. Though a reduction of $\bar{\Gamma}$ could not be achieved with a stiffened housing 31, it has been demonstrated that the use of weights 23 (i.e., mass loading) can be used to decrease the vibration sensitivity for a particular direction. This has application for SAW oscillator circuits with thick stiffeners 52 which have very low vibration sensitivity requirements for only one or two axes.

Thus, in accordance with the present invention, a practical method for reducing the vibration sensitivity of SAW oscillator circuits for the case where housing deflections cannot be eliminated. SAW oscillator circuits with this improvement have application in high vibration environments such as missile and aircraft, where packaging constraints are critical. As described above, the vibration sensitivity of a SAW oscillator circuit can be reduced by the effect of mass loading. This scheme is particularly useful in SAW oscillator circuits where sufficiently thick alumina stiffeners cannot be used because of space limitations. On oscillator circuits with thick stiffeners it has been demonstrated that, with mass loading, the direction of $\bar{\Gamma}$ can be manipulated which results in a reduction of the vibration sensitivity along one particular axis.

A preferred technique to fabricate an All Quartz Package is generally described in patent applications Ser. No. 221,449 filed Jun. 29, 1988 by Greer et. al. and Ser. No. 650,017 filed Sep. 13, 1984 by Borcheldt et. al. both assigned to the assignee of the present invention. To provide a mini-AQP, the glass frit seal is positioned as close as possible to the interdigitated transducers without touching the transducers or interfering with surface wave propagation. The cover and base substrates are also cut correspondingly as small as possible to thus reduce the overall size of the package.

In high vibration environments, it is desirable to mount the SAW oscillator housing on a vibration isolation mount as would be known by one of skill in the art.

One example of an isolation mount which would be preferred would include a mounting plate, comprised of a stiff metal, having four holes disposed on thinned corner regions of the plate to receive plastic or rubber type grommets. A preferred grommet is a type obtained from EAR, Inc., EAR Type 401-1 fabricated from polyvinylchloride (PVC). Generally, such an assembly would be desired to have a known fundamental resonant frequency. To insure optimum operation and hence maximum damping of vibrations, the grommets which serve as mounting holes for the plate are prestressed by passing fasteners through each hole in the grommet, and the grommets as well as the reset of the assembly are maintained at a predetermined temperature as here 60° C. This maintains the proper temperature for the SAW device and proper durometer rating for the grommets.

Having described preferred embodiments of the invention, it will now become apparent to one of skill in the art that other embodiments incorporating their concepts may be used. It is felt, therefore, that these embodiments should not be limited to disclosed embodiments, but rather should be limited only by the spirit and scope of the appended claims.

What is claimed is:

1. A SAW device, comprising:
   a surface wave propagation supporting substrate;
   a pair of transducers coupled to said surface wave propagation supporting substrate; and
   means for reducing effects of vibration deflection in the surface wave propagation supporting substrate comprising: a weight attached to the substrate.

2. The SAW device recited in claim 1 wherein the substrate has a pair of opposing surfaces, the pair of transducers disposed on one of the surfaces and the weight being attached to the other surface.

3. The SAW device recited in claim 2 including a second weight, the first mentioned weight and the second weight being attached to the substrate at opposite sides of the center of the substrate.

4. An oscillator circuit, comprising:
   a housing having disposed therein:
   (i) a resonator, comprising:
      a surface wave propagation supporting substrate;
      a pair of transducers coupled to said surface wave propagating supporting substrate;

a discrete weight attached to the substrate;

(ii) electronic circuitry coupled to the pair of transducers and arranged with the resonator to provide the oscillator circuit; and (iii) wherein such housing is susceptible of vibratory deflections, such vibratory deflections inducing vibratory deflections in the substrate and wherein the weight is selected and positioned to suppress the effects of the vibratory deflections induced in the substrate.

5. The oscillator circuit recited in claim 4 wherein the resonator includes a cover disposed to enclose the surface wave propagation surface of the substrate.

6. A SAW oscillator, comprising:

(a) means for providing a closed electrical circuit loop having an integral multiple of $2\pi$ radians of phase shift and excess small signal gain at a selected frequency, said means further including:

(i) a surface acoustic wave resonator having a substrate with a surface which supports surface wave propagation and an opposing surface;

(ii) a pair of transducers coupled to said surface wave propagation surface;

(iii) a cover;

(iv) a glass frit seal used to connect the cover and the substrate to enclose the surface wave propagation surface of the SAW substrate; and (v) a weight attached to the opposing surface of the substrate; and (b) a housing comprising: a base for supporting the closed electrical circuit loop means; and (c) wherein the weight suppresses the effects of vibratory deflections induced in the substrate by vibratory deflections of the housing.

7. In combination:

(a) a resonator package, comprising:

(i) a substrate having a surface which supports surface wave propagation and having coupled to said surface a pair of transducers;

(ii) a cover disposed to enclose said surface wave propagation surface of said SAW device; and (iii) a glass frit seal disposed between said cover and said substrate; and (b) means for suppressing effects of vibration deflection induced in the substrate comprising: a weight disposed at a predetermined position on the substrate.

8. The combination recited in claim 7 wherein said cover and substrate are comprised of crystallographically matched materials.

9. The combination recited in claim 8 wherein said material is ST-cut of quartz.

10. A SAW oscillator comprising:

(a) a resonator package, comprising:

a substrate having a surface which supports surface wave propagation and having coupled to said surface a pair of transducers;

a cover disposed to enclose said surface of said substrate; and a glass frit seal disposed between said cover and said substrate;

(b) means for providing a closed loop having an integral number of $2\pi$ radians of phase shift and an excess small signal gain at a frequency with said closed loop providing means including said resonator package;

(c) an oscillator housing comprising:

a base supporting said package; and a cover disposed to enclose said base of the oscillator housing;

(d) a weight attached to the substrate at a predetermined position, wherein said weight is disposed at a predetermined position of the substrate selected to reduce the effect of vibratory deflection induced in the substrate by vibratory deflections of the housing.

11. The SAW oscillator recited in claim 10, wherein the substrate has a pair of opposing surfaces, the pair of transducers being mutually coupled through waves propagating along a first one of the opposing surfaces and the weight being attached to the other surface of the substrate.

12. The SAW oscillator recited in claim 11 wherein the cover is attached to a base portion of the housing.

* * * * *